United States Patent
Kameyama

(10) Patent No.: US 9,627,955 B2
(45) Date of Patent: Apr. 18, 2017

(54) SEMICONDUCTOR MODULE

(71) Applicant: Satoru Kameyama, Toyota (JP)

(72) Inventor: Satoru Kameyama, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/110,653

(22) PCT Filed: Jan. 7, 2015

(86) PCT No.: PCT/JP2015/050291
§ 371 (c)(1),
(2) Date: Jul. 8, 2016

(87) PCT Pub. No.: WO2015/125507
PCT Pub. Date: Aug. 27, 2015

(65) Prior Publication Data
US 2016/0352211 A1  Dec. 1, 2016

(30) Foreign Application Priority Data
Feb. 18, 2014 (JP) .................. 2014-028704

(51) Int. Cl.
*H01L 29/78* (2006.01)
*H02M 1/088* (2006.01)
(Continued)

(52) U.S. Cl.
CPC ......... *H02M 1/088* (2013.01); *H01L 23/3114* (2013.01); *H01L 23/49844* (2013.01); *H01L 25/0655* (2013.01); *H01L 27/0727* (2013.01); *H01L 27/0761* (2013.01); *H01L 29/063* (2013.01); *H01L 29/0834* (2013.01);
(Continued)

(58) Field of Classification Search
CPC ............... H01L 29/063; H01L 27/0727; H01L 25/0655; H01L 23/49844; H01L 23/3114; H01L 27/0761; H01L 29/861; H01L 29/1095; H01L 29/78; H01L 29/7397; H01L 29/0834; H01L 29/32; H01L 29/8613; H01L 29/407; H02M 3/155;
(Continued)

(56) References Cited

U.S. PATENT DOCUMENTS 5,101,244 A    3/1992  Mori et al.
2001/0033477 A1  10/2001  Inoue et al.
(Continued)

FOREIGN PATENT DOCUMENTS

JP  H03-195376 A  8/1991
JP  H08-306859 A  11/1996
(Continued)

*Primary Examiner* — Yasser A Abdelaziez
(74) *Attorney, Agent, or Firm* — Oliff PLC

(57) ABSTRACT

A semiconductor module is provided with a high potential wiring, an output wiring, a low potential wiring, an upper arm switching device, an upper arm diode, a lower arm switching device, and a lower arm diode. A ratio of steady loss to switching loss of the upper arm switching device is configured to be smaller than a ratio of steady loss to switching loss of the lower arm switching device. Further, a ratio of steady loss to switching loss of the upper arm diode is configured to be smaller than a ratio of steady loss to switching loss of the lower arm diode.

12 Claims, 4 Drawing Sheets

(51) Int. Cl.

| | | |
|---|---|---|
| *H02M 3/155* | (2006.01) | |
| *H01L 29/32* | (2006.01) | |
| *H01L 29/861* | (2006.01) | |
| *H01L 27/07* | (2006.01) | |
| *H01L 29/739* | (2006.01) | |
| *H01L 29/08* | (2006.01) | |
| *H01L 23/31* | (2006.01) | |
| *H01L 23/498* | (2006.01) | |
| *H01L 25/065* | (2006.01) | |
| *H01L 29/06* | (2006.01) | |
| *H01L 29/10* | (2006.01) | |
| *H02M 3/158* | (2006.01) | |
| *H01L 29/40* | (2006.01) | |
| *H02M 1/00* | (2006.01) | |

(52) U.S. Cl.
CPC .......... *H01L 29/1095* (2013.01); *H01L 29/32* (2013.01); *H01L 29/7397* (2013.01); *H01L 29/78* (2013.01); *H01L 29/861* (2013.01); *H01L 29/8613* (2013.01); *H02M 3/155* (2013.01); *H02M 3/158* (2013.01); *H01L 29/407* (2013.01); *H02M 2001/0048* (2013.01); *H02M 2001/0054* (2013.01); *Y02B 70/1491* (2013.01)

(58) Field of Classification Search
CPC . H02M 2001/0048; H02M 2001/0054; H02M 3/158; H02M 1/088; Y02B 70/1491
See application file for complete search history.

(56) References Cited

U.S. PATENT DOCUMENTS

| | | | |
|---|---|---|---|
| 2009/0225578 A1* | 9/2009 | Kitabatake | H01L 29/0696 363/132 |
| 2010/0244092 A1 | 9/2010 | Ishikawa et al. | |
| 2011/0267781 A1 | 11/2011 | Takayanagi et al. | |
| 2012/0212170 A1* | 8/2012 | Matsui | H02M 7/5388 318/503 |
| 2015/0378376 A1* | 12/2015 | Matsui | G01K 7/01 327/513 |

FOREIGN PATENT DOCUMENTS

| | | | |
|---|---|---|---|
| JP | 10108474 | * | 4/1998 |
| JP | 2001-308263 A | | 11/2001 |
| JP | 2010-199628 A | | 9/2010 |
| JP | 2010-232576 A | | 10/2010 |
| JP | 2011-233722 A | | 11/2011 |
| JP | 2013-051272 A | | 3/2013 |
| JP | 2013-131774 A | | 7/2013 |

* cited by examiner

SEMICONDUCTOR MODULE

TECHNICAL FIELD

This application is a related application of Japanese Patent Application No. 2014-028704 filed on Feb. 18, 2014, and claims priority thereto, and the entire contents thereof are hereby incorporated by reference into the present application.

The technique disclosed herein relates to a semiconductor module.

BACKGROUND ART

Japanese Patent Application Publication No. 2001-308263 (hereinbelow referred to as Patent Literature 1) discloses a semiconductor module that includes a first wiring, a second wiring, a third wiring, an upper arm-side semiconductor chip connected between the first wiring and the second wiring, and a lower arm-side semiconductor chip connected between the second wiring and the third wiring. The first wiring, the second wiring, the third wiring, the upper arm-side semiconductor chip, and the lower arm-side semiconductor chip are resin molded. Each semiconductor chip includes a switching device and a diode.

SUMMARY OF INVENTION

Technical Problem

In a type of semiconductor module as the one in Patent Literature 1, a further loss reduction is desired. In order to reduce a loss in such a semiconductor module, loss reduction in the switching device and the diode becomes necessary. Losses generated in these devices include steady loss and switching loss. However, the steady loss and the switching loss are in a trade-off relationship, so it is difficult to reduce both of them simultaneously.

Solution to Technical Problem

The inventor of the present application found that in a buck-boost circuit provided with the aforementioned type of semiconductor module, the loss generated in an upper arm in many cases has a higher steady loss ratio compared to the loss generated in a lower arm. Therefore, a semiconductor module disclosed herein comprises a first wiring; a second wiring; a third wiring; an upper arm switching device connected between the first wiring and the second wiring; an lower arm switching device connected between the second wiring and the third wiring; an upper arm diode connected between the first wiring and the second wiring such that the first wiring is connected to a cathode side; and a lower arm diode connected between the second wiring and the third wiring such that the second wiring is connected to a cathode side. At least one of the following (a) and (b) is satisfied: (a) a ratio of steady loss to switching loss of the upper arm diode is smaller than a ratio of steady loss to switching loss of the lower arm diode; and (b) a ratio of steady loss to switching loss of the upper arm switching device is smaller than a ratio of steady loss to switching loss of the lower arm switching device.

Notably, the above (a) means that the ratio of steady loss to switching loss of the upper arm diode becomes smaller than the ratio of steady loss to switching loss of the lower arm diode when the upper arm switching device and the lower arm switching device are operated under the same voltage condition. Further, the above (b) means that the ratio of steady loss to switching loss of the upper arm switching device becomes smaller than the ratio of steady loss to switching loss of the lower arm switching device when the upper arm switching device and the lower arm switching device are operated under the same voltage condition.

In the above semiconductor module, as described in the above (a) and (b), the steady loss is less likely to occur in the upper arm than in the lower arm, and the switching loss is less likely to occur in the lower arm than in the upper arm. According to this configuration, the switching loss is suppressed in the lower arm where the switching loss ratio is high, so a total amount of loss generated in the lower arm (that is, the total amount of the steady loss and the switching loss) can be reduced. Further, according to this configuration, the steady loss is suppressed in the upper arm where the steady loss ratio is high, so a total amount of loss generated in the upper arm can be reduced. Accordingly, by employing devices with different characteristics in the upper arm and the lower arm, the total amount of loss in the entire semiconductor module can be reduced.

Crystal defects of the upper arm diode may be fewer than crystal defects of the lower arm diode.

According to this configuration, the ratio of steady loss to switching loss of the upper arm diode can be made smaller than the ratio of steady loss to switching loss of the tower arm diode.

The upper arm switching device and the lower arm switching device may be IGBTs (abbreviation of Insulated Gate Bipolar Transistors). A p-type impurity density of a collector region of the upper arm switching device may be higher than a p-type impurity density of a collector region of the lower arm switching device.

According to this configuration, the ratio of steady loss to switching loss of the IGBT being the upper arm switching device can be made smaller than the ratio of steady loss to switching loss of the IGBT being the lower arm switching device.

Another semiconductor module disclosed herein also comprises a first wiring; a second wiring; a third wiring; an upper arm switching device connected between the first wiring and the second wiring; an lower arm switching device connected between the second wiring and the third wiring; an upper arm diode connected between the first wiring and the second wiring such that the first wiring is connected to a cathode side; and an lower arm diode connected between the second wiring and the third wiring such that the second wiring is connected to a cathode side. A ratio of a device area of the upper arm diode to a device area of the upper arm switching device is larger than a ratio of a device area of the lower arm diode to a device area of the lower arm switching device.

By a keen study of the inventor of the present application, it has been found that in many cases an energization amount of the upper arm diode is greater than an energization amount of the lower arm diode, and an energization amount of the lower arm switching device is greater than an energization amount of the upper arm switching device.

In this regard, in the aforementioned semiconductor module, the ratio of the device area of the upper arm diode to the device area of the upper arm switching device is greater than the ratio of the device area of the lower arm diode to the device area of the lower arm switching device. Here, "device area" includes an area of a region where the switching device and the diode are formed as seen in a plan view. The term "device area" may in other words be described as an area of a region where current flows. That is, large current can flow through the upper arm diode as compared to the lower arm diode. Further, a large current can be flown through the lower arm switching device as compared to the upper arm switching device. Thus, in the above semiconductor module, the respective devices can suitably be operated upon its usage.

A total device area of the upper area switching device and the upper arm diode may be equal to a total device area of the lower arm switching device and the lower arm diode.

According to this configuration, an upper arm-side device (that is, the upper arm switching device and the upper arm diode) and a lower arm-side device (that is, the lower arm switching device and the lower arm diode) can be configured by a same size. By configuring the semiconductor module by using the devices of the same size, arrangement structures of the devices and wirings in the module do not become complicated.

The upper arm switching device and the upper arm diode may be provided in a first semiconductor substrate. The lower arm switching device and the lower arm diode may be provided in a second semiconductor substrate.

According to this configuration, the upper arm switching device and the upper area diode do not have to be provided on separate substrates. Similarly, the lower arm switching device and the lower arm diode do not have to be provided on separate substrates.

A substrate area of the first semiconductor substrate may be equal to a substrate area of the second semiconductor substrate.

According to this configuration, the upper arm-side device and the lower arm-side device can be configured by the same size. By configuring the semiconductor module by using the devices of the same size, the arrangement structures of the devices and wirings in the module do not become complicated.

The upper arm switching device, the upper arm diode, the lower arm switching device, and the lower arm diode may be integrally resin molded.

According to this configuration, the respective devices configuring the semiconductor module can be suppressed from exhibiting variations,

DESCRIPTION OF EMBODIMENTS

First Embodiment

Figure 1:
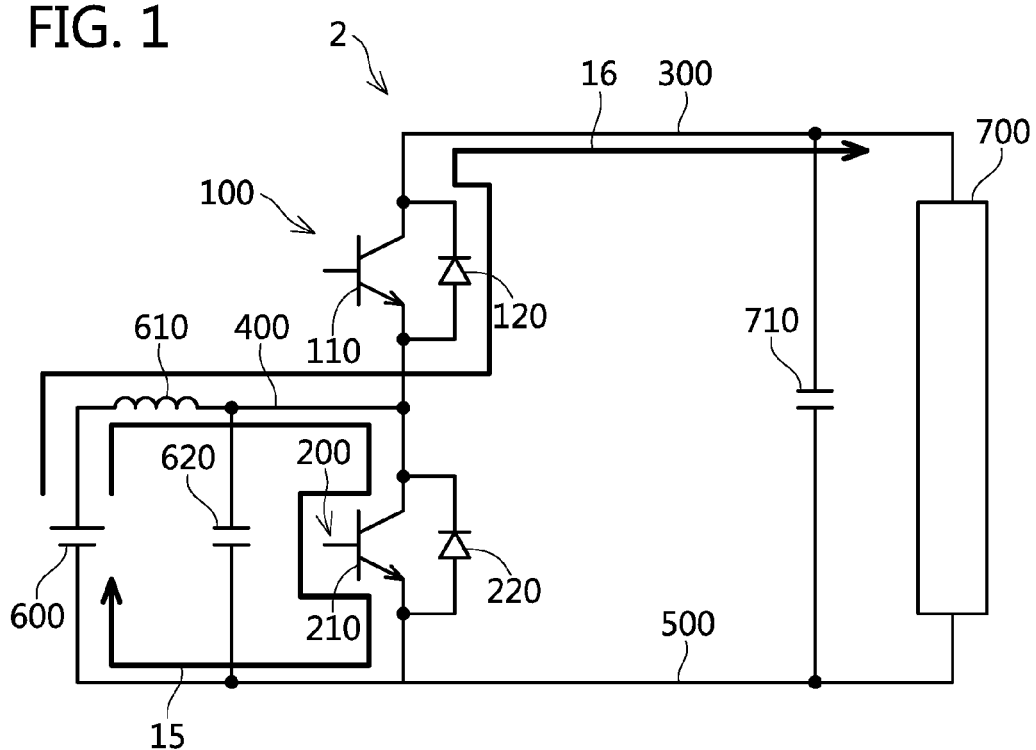
FIG. 1 shows a circuit configuration of a semiconductor module.

As shown in FIG. 1, a semiconductor module 2 of the present embodiment comprises a high potential wiring 300, an output wiring 400, a low potential wiring 500, an upper arm semiconductor device 100, a lower arm semiconductor device 200, a battery 600, and an inverter circuit 700. The semiconductor module 2 of the present embodiment is installed in a hybrid vehicle or in an electric vehicle. The upper arm semiconductor device 100 is connected between the high potential wiring 300 and the output wiring 400. The lower arm semiconductor device 200 is connected between the output wiring 400 and the low potential wiring 500. The inverter circuit 700 is a circuit for driving a motor of a vehicle. The semiconductor module 2 boosts an output voltage of the battery 600 and supplies the same to the inverter circuit 700.

The high potential wiring 300, the output wiring 400, and the low potential wiring 500 are respectively configured by wiring materials having conductivity, for example, by aluminum plates.

A negative terminal of the battery 600 is connected to the low potential wiring 500. A positive terminal of the battery 600 is connected to one end of a reactance 610. The other end of the reactance 610 is connected to the output wiring 400. Further, a filter capacitor 620 is connected between the output wiring 400 and the low potential wiring 500 by being parallel to a serial circuit of the battery 600 and the reactance 610.

The inverter circuit 700 is connected between the high potential wiring 300 and the low potential wiring 500. Further, a main capacitor 710 is connected between the high potential wiring 300 and the low potential wiring 500 by being parallel to the inverter circuit 700.

The upper arm semiconductor device 100 comprises an upper arm switching device 110 and an upper arm diode 120. The upper arm switching device 110 is an IGBT. A collector of the upper arm switching device 110 is connected to the high potential wiring 300, and an emitter of the upper arm switching device 110 is connected to the output wiring 400. The upper arm diode 120 is connected between the high potential wiring 300 and the output wiring 400 so that the high potential wiring 300 is connected to the cathode.

The lower arm semiconductor device 200 comprises a lower arm switching device 210 and a lower arm diode 220. The lower arm switching device 210 is an IGBT. A collector of the lower arm switching device 210 is connected to the output wiring 400, and an emitter of the lower arm switching device 210 is connected to the low potential wiring 500. The lower arm diode 220 is connected between the output wiring 400 and the low potential wiring 500 so that the output wiring 400 is connected to its cathode side.

The circuit of FIG. 1 alternately turns on and turns off the upper arm switching device 110 and the lower arm switching device 210. In a state where a voltage of the high potential wiring 300 is lower than a predetermined value, a current flows in a first return current circuit 15 as shown by an arrow 15 in FIG. 1 if the upper arm switching device 110 is in an off state and the lower arm switching device 210 is in an on state. Due to this, energy is charged in the reactance 610. Next, when the upper arm switching device 110 turns on and the lower arm switching device 210 turns off, a current flows in a voltage supplying circuit 16 as shown by an arrow 16 in FIG. 1. In this state, electromotive force is generated in the reactance 610 in a direction along which a potential of the output wiring 400 is increased. Thus, a high voltage in which the output voltage of the battery 600 and the electromotive force of the reactance 610 are superposed is outputted to the high potential wiring 300. Due to this, the voltage of the high potential wiring 300 is boosted.

Figure 2:
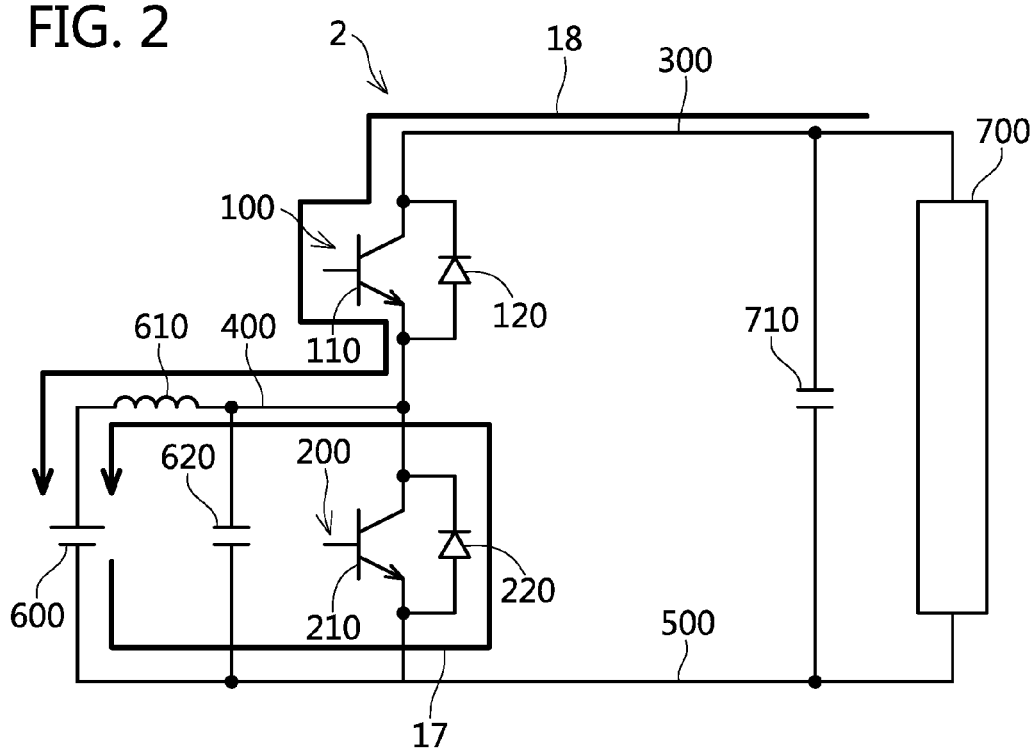
FIG. 2 shows a circuit configuration of the semiconductor module.

Further, in a state where the voltage of the high potential wiring 300 is higher than the predetermined value, a current flows in a second return current circuit 17 as shown by an arrow 17 in FIG. 2 if the upper arm switching device 110 is in the of state and the lower arm switching device 210 is in the on state. Due to this, energy is charged in the reactance 610. Next, when the upper arm switching device 110 turns on and the lower arm switching device 210 turns off, a current flows in a charging circuit 18 as shown by an arrow 18 in FIG. 2. In this state, the electromotive force is generated in the reactance 610 in the direction along which the potential of the output wiring 400 is increased. Thus, a voltage in which the voltage of the output wiring 400 is reduced by the electromotive force of the reactance 610 is applied to the positive terminal of the battery 600. Due to this, the battery 600 is charged.

Figure 3:
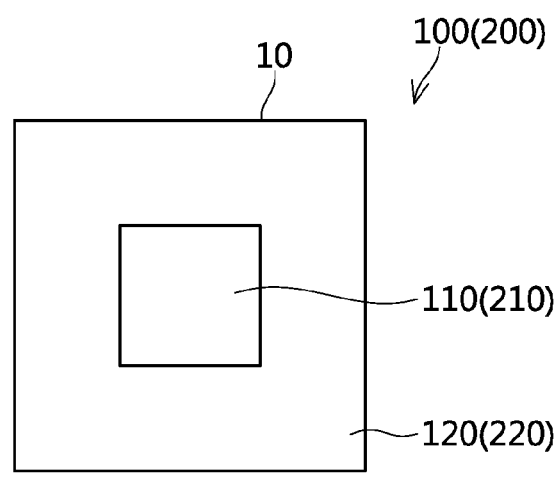
FIG. 3 is a plan view of an upper arm semiconductor device and a lower arm semiconductor device of a first embodiment.

In the present embodiment, as shown in FIG. 3, the upper arm semiconductor device 100 is provided within one piece of semiconductor substrate 10. That is, the upper arm semiconductor device 100 is an RC-IGBT (abbreviation of Reverse Conducting-IGBT) that comprises the upper arm switching device 110 and the upper arm diode 120 within one piece of semiconductor substrate 10. As shown in FIG. 3, in a case of viewing the semiconductor substrate 10 in a plan view, the upper arm switching device 110 is provided in a vicinity of a center of the semiconductor substrate 10, and the upper arm diode 120 is provided around the upper arm switching device 110. Notably, in FIG. 3, depiction of an interlayer insulating film and a front surface electrode provided on a front surface of the semiconductor substrate 10 is omitted.

Figure 4:
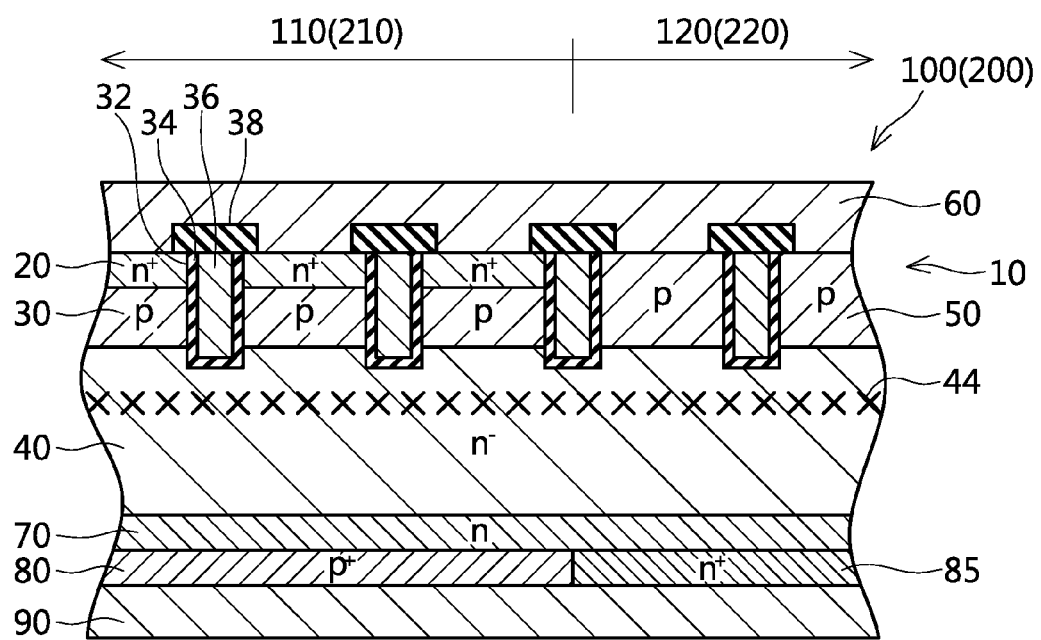
FIG. 4 is a cross sectional view of the upper arm semiconductor device and the lower arm semiconductor device of the first embodiment.

With reference to FIG. 4, a cross sectional structure of the upper arm semiconductor device 100 will be described. As above, the upper arm semiconductor device 100 is an RC-IGBT that comprises the upper arm switching device (IGBT) 110 and the upper arm diode 120 within the semiconductor substrate 10.

An n-type emitter region 20, a p-type body region 30, an n-type drift region 40, an n-type buffer region 70, and a p-type collector region 80 are provided in the upper arm switching device 110. An upper surface of the emitter region 20 makes ohmic contact with a front surface electrode 60. A lower surface of the collector region 80 makes ohmic contact with a rear surface electrode 90. Further, the upper arm switching device 110 is provided with a plurality of gate trenches 32. A trench gate electrode 36 covered by a gate insulating film 34 is provided inside each of the gate trenches 32. Upper surfaces of the trench gate electrodes 36 are covered by insulating layers 38, and are insulated from the front surface electrode 60. The trench gate electrodes 36 are electrically connected to an external component at positions not shown.

A p-type anode region 50, an n-type drift region 40, an n-type buffer region 70, and an n-type cathode region 85 are provided in the upper arm diode 120. An upper surface of the anode region 50 makes ohmic contact with the front surface electrode 60. A lower surface of the cathode region 85 makes ohmic contact with the rear surface electrode 90. The drift region 40 and the buffer region 70 in the upper arm diode 120 are continuous with the drift region 40 and the buffer region 70 of the upper arm switching device 110. Further, the upper arm diode 120 is provided with a plurality of gate trenches 32 similar to the upper arm switching device 110.

In the semiconductor substrate 10, a crystal defect region 44 created by implanting helium ions is present. In the crystal defect region 44, a crystal defect density is higher than its surrounding drift region 40. The crystal defect region 44 is arranged continuously over the upper arm switching device 110 and the upper arm diode 120.

In the present embodiment, the front surface electrode 60 of the upper arm semiconductor device 100 is connected to the output wiring 400, and the rear surface electrode 90 is connected to the high potential wiring 300 (see FIG. 1).

Further, the lower arm semiconductor device 200 has a similar plan-view structure as the upper arm semiconductor device 100 shown in FIG. 3. That is, the lower arm semiconductor device 200 is also an RC-IGBT that comprises the lower arm switching device 210 and the lower arm diode 220 within one piece of semiconductor substrate 10. In the present embodiment, the lower arm semiconductor device 200 is provided in the semiconductor substrate 10 having a same substrate area as the upper arm semiconductor device 100. Similar to the case of the upper arm semiconductor device 100, the lower arm switching device 210 is provided in a vicinity of a center of the semiconductor substrate 10, and the lower arm diode 220 is provided around the lower arm switching device 210.

In the present embodiment, a device area of the upper arm switching device 110 and a device area of the lower arm switching device 210 are equal. Similarly, a device area of the upper arm diode 120 and a device area of the lower arm diode 220 are equal. In the present description, a "device area" means an area of a region where the switching device and the diode are provided when the semiconductor substrate 10 is seen in its plan view. The term "device area" may also be referred to as an area of a region where a current flows. Thus, in the present embodiment, a ratio of the device area of the upper arm diode 120 to the device area of the upper arm switching device 110 is equal to a ratio of the device area of the lower arm diode 220 to the device area of the lower arm switching device 210. Further, a total device area of the upper arm switching device 110 and the upper arm diode 120 is equal to a total device area of the lower arm switching device 210 and the lower arm diode 220.

Further, a cross sectional structure of the lower arm semiconductor device 200 is almost the same as the cross sectional structure of the upper arm semiconductor device 100 shown in FIG. 4. In FIG. 4, elements of the lower arm semiconductor device 200 that are in common with the upper arm semiconductor device 100 are given the same reference signs. However, it differs from the upper arm semiconductor device 100 in that the front surface electrode 60 of the lower arm semiconductor device 200 is connected to the low potential wiring 500, and the rear surface electrode 90 is connected to the output wiring 400 (see FIG. 1).

In the first embodiment, a p-type impurity density of the collector region 80 of the upper aura switching device 110 is higher than a p-type impurity density of the collector region 80 of the lower arm switching device 210. Notably, in the first embodiment, a crystal defect amount in the crystal defect region 44 in the upper arm diode 120 is substantially the same as a crystal defect amount in the crystal defect region 44 in the lower arm diode 220. Here, the term "impurity density" may be an average impurity density in the relevant region. Thus, for example, when the collector region 80 of the upper arm switching device 110 is to be formed, a larger amount of p-type impurity (for example, phosphorus) may be implanted therein than in forming the collector region 80 of the lower arm switching device 210. Due to this, the upper arm switching device 110 has a stricture that is more resistant to steady loss as compared to the lower arm switching device 210 but more prone to switching loss. That is, if the switching devices 110, 210 are operated under a same condition, the upper arm switching device 110 would have a smaller steady loss as compared to the lower arm switching device 210, however would have a larger switching loss.

In the circuit shown in FIG. 1 and FIG. 2, the respective devices operate under a condition by which the steady loss occurs more and the switching loss occurs less in the upper arm than in the lower arm. That is, in assuming that the switching devices 110, 210 have an identical property, the steady loss becomes greater in the upper arm switching device 110 than in the lower arm switching device 210, and the switching loss thereof becomes smaller. However, in the configuration of the first embodiment, as described above, the upper arm switching device 110 has the structure more resistant to the steady loss than the lower arm switching device 210. Thus, the steady loss in the upper arm switching device 110 can be reduced. Further, although the upper arm switching device 110 has the structure more prone to the switching loss, not so much switching loss is generated under the operating condition of the upper arm switching device 110. Due to this, a total amount of loss generated in the upper arm switching device 110 is small.

Further, the lower arm switching device 210 that operates under a condition prone to the switching loss has the structure resistant to the switching loss, so the switching loss can be reduced. Further, although the lower arm switching device 210 has the structure more prone to the steady loss, not so much steady loss is generated under the operating condition of the lower arm switching device 210. Due to this, a total amount of loss generated in the lower arm switching device 210 is small.

As described above, according to the configuration of the first embodiment, a total amount of loss generated in the semiconductor module 2 can be reduced.

Further, in the present embodiment, the upper arm switching device 110 and the upper arm diode 120 are arranged within one piece of semiconductor substrate 10. Similarly, the lower arm switching device 210 and the lower arm diode 220 are arranged within one piece of semiconductor substrate 10. Due to this, in the present embodiment, the upper arm switching device 110 and the upper arm diode 120 do not have to be arranged on separate substrates. Similarly, the lower arm switching device and the lower arm diode do not have to be arranged on separate substrates.

Further, in the present embodiment, the total device area of the upper arm switching device 110 and the upper arm diode 120 is equal to the total device area of the lower arm switching device 210 and the lower arm diode 220. Further, in the present embodiment, a substrate area of the semiconductor substrate 10 on which the upper arm semiconductor device 100 is arranged is equal to a substrate area of the semiconductor substrate 10 on which the lower arm semiconductor device 200 is arranged. Due to this, the semiconductor module 2 can be fabricated using the devices of the same size, so arrangement structures of the devices and wirings in the module do not become complicated.

The high potential wiring 300 is an example of a "first wiring". The output wiring 400 is an example of a "second wiring". The low potential wiring 500 is an example of a "third wiring". The drift region 40, the buffer region 70, and the cathode region 85 of the upper arm diode 120 (or lower arm diode 220) are examples of a "cathode region". The semiconductor substrate 10 on which the upper arm semiconductor device 100 is arranged is an example of a "first semiconductor substrate". The semiconductor substrate 10 on which the lower arm semiconductor device 200 is arranged is an example of a "second semiconductor substrate".

Second Embodiment

In a second embodiment, the p-type impurity density of the collector region 80 is substantially the same in the upper arm switching device 110 and the lower arm switching device 210. However, in the second embodiment, the crystal defect amount in the crystal defect region 44 of the upper arm diode 120 is less than the crystal defect amount in the crystal defect region 44 of the lower arm diode 220. For example, when the crystal defect region 44 of the lower arm diode 220 is formed, a greater amount of helium ions is implanted therein than when the crystal defect region 44 of the upper arm diode 120 is formed. Other configurations of the second embodiment are similar to those of the first embodiment.

The crystal defect region 44 reduces the switching loss in the diode (loss generated upon when the diode performs reverse recovery), and on the other hand increases the steady loss of the diode. Thus, in the upper arm diode 120 having the smaller crystal defect amount has the structure more resistant to the steady loss but more prone to the switching loss than the lower arm diode 220 having the great crystal defect amount.

In the circuit shown in FIGS. 1 and 2, the respective devices operate under the condition by which the steady loss occurs more and the switching loss occurs less in the upper arm than in the lower arm. That is, in assuming that the diodes 120, 220 have the identical property, the steady loss becomes greater in the upper arm diode 120 than in the lower arm diode 220, and the switching loss thereof becomes smaller. However, in the configuration of the second embodiment, as described above, the upper arm diode 120 has the structure more resistant to the steady loss than the lower arm diode 220. Thus, the steady loss in the upper arm diode 120 can be reduced. Further, although the upper arm diode 120 has the structure more prone to the switching loss, not so much switching loss is generated under the operating condition of the upper arm diode 120. Due to this, a total amount of loss generated in the upper arm diode 120 is small.

Further, the lower arm diode 220 that operates under a condition prone to the switching loss has the structure resistant to the switching loss, so the switching loss can be reduced. Further, although the lower arm diode 220 has the structure more prone to the steady loss, not so much steady loss is generated under the operating condition of the lower arm diode 220. Due to this, a total amount of loss generated in the lower arm diode 220 is small.

As described above, according to the configuration of the second embodiment, the total amount of loss generated in the semiconductor module 2 can be reduced.

As described above, in the first embodiment, a ratio of steady loss to switching loss in the upper arm switching device 110 is smaller than a ratio of steady loss to switching loss in the lower arm switching device 210. In the second embodiment, a ratio of steady loss to switching loss in the upper arm diode 120 is smaller than a ratio of steady loss to switching loss in the lower arm diode 220. By setting the ratios of steady loss to switching loss of the respective devices as in the first and second embodiments, the total amount of loss generated in the semiconductor module as a whole can be reduced.

Notably, a difference may be provided in the ratios of steady loss to switching loss between the upper arm and the lower arm by a method different from those of the first and second embodiments. Further, both structures of the first and second embodiments may be employed in one semiconductor module 2.

Third Embodiment

Figure 5:
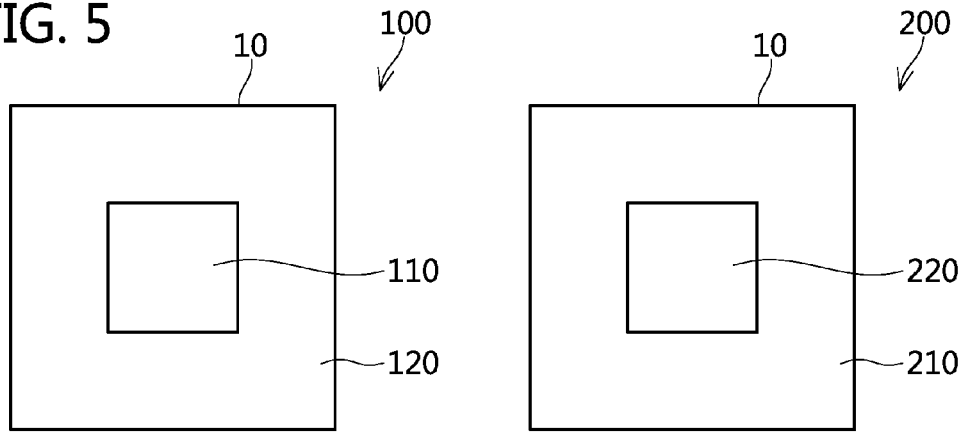
FIG. 5 is a plan view of an upper arm semiconductor device and a lower arm semiconductor device of a third embodiment.

In a third embodiment, the p-type impurity density of the collector region 80 of the upper arm switching device 110 is substantially the same as the p-type impurity density of the collector region 80 of the lower arm switching device 210. Further, the crystal defect amount in the crystal defect region 44 of the upper arm diode 120 is substantially the same as the crystal defect amount in the crystal defect region 44 of the lower arm diode 220. However, in the third embodiment, as shown in FIG. 5, a ratio of the device area of the upper arm diode 120 to the device area of the upper arm switching device 110 is larger than a ratio of the device area of the lower arm diode 220 to the device area of the lower arm switching device 210. As shown in FIG. 5, in the upper arm semiconductor device 100, the upper arm diode 120 is provided around the upper arm switching device 110, in the lower arm semiconductor device 200, the lower arm switching device 210 is provided around the lower arm diode 220. Other configurations of the third embodiment are similar to those of the first embodiment. Notably, in the third embodiment as well, the total device area of the upper arm switching device 110 and the upper arm diode 120 is equal to the total device area of the lower arm switching device 210 and the lower arm diode 220.

As shown in FIG. 5, in the third embodiment as well, the upper arm semiconductor device 100 and the lower arm semiconductor device 200 are respectively provided in the semiconductor substrates 10 having the same substrate area. Due to this, in the present embodiment, the device area of the upper arm diode 120 is larger than the device area of the lower arm diode 220. That is, a larger current can flow through the upper arm diode 120 as compared to the lower arm diode 220 (that is, a current capacity thereof is large). Further, the device area of the upper arm switching device 110 is smaller than the device area of the lower arm switching device 210. That is, a larger current can be flow through the lower arm switching device 210 as compared to the upper arm switching device 110 (that is, a current capacity thereof is large).

In the circuit shown in FIGS. 1 and 2, a larger current flows in the upper arm diode 120 than in the lower arm diode 220. Further, a larger current flows in the lower arm switching device 210 than in the upper arm switching device 110. As above, according to the structure of the third embodiment, the current capacity of the upper arm diode 120 is large, and the current capacity of the lower arm switching device 210 is large. Thus, in the configuration of the third embodiment, each of the devices can more appropriately be operated. That is, according to this configuration, the current capacities of the respective devices in the semiconductor module 2 can be optimized without increasing a size of the semiconductor module 2. Notably, in a single semiconductor module 2, the structure of the third embodiment may be employed together with those of the first and second embodiments.

Further, as shown in FIG. 5, in the third embodiment, in the upper arm semiconductor device 100, the upper arm diode 120 is provided around the upper arm switching device 110. In the lower arm semiconductor device 200, the lower arm switching device 210 is provided around the lower arm diode 220. In the upper arm semiconductor device 100, the upper arm diode 120 where the large current flows comes to have a highest temperature. In the lower arm semiconductor device 200, the lower arm switching device 210 where the large current flows comes to have a highest temperature. By offsetting the upper arm diode 120 and the lower arm switching device 210 being the portions with the highest temperatures from the centers of the semiconductor substrate 10, the upper arm semiconductor device 100 and the lower arm semiconductor device 200 can be cooled efficiently. Due to this, chip sizes of the upper arm semiconductor device 100 and the lower arm semiconductor device 200 can be made compact.

Figure 6:
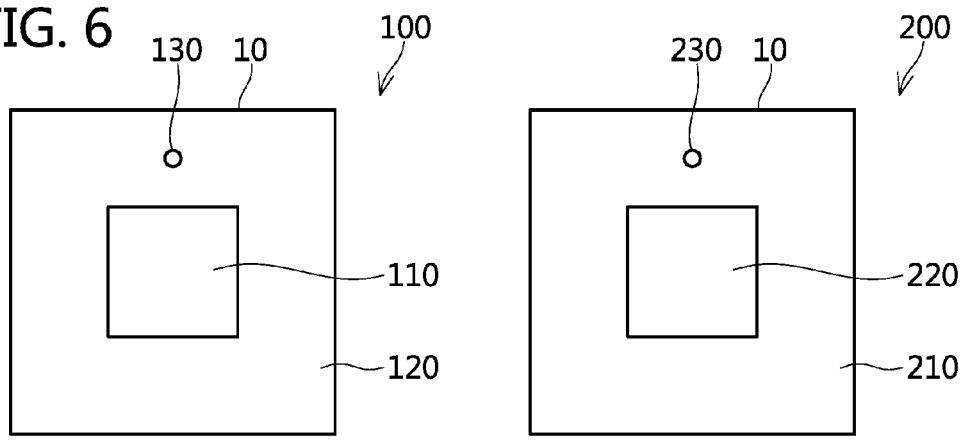
FIG. 6 is a plan view of an upper arm semiconductor device and a lower arm semiconductor device of a modification of the third embodiment.

Further, as a modification of the third embodiment, as shown in FIG. 6, temperature sensors 130, 230 may be provided in the upper arm diode 120 and the lower arm switching device 210 where the large currents flow. By providing the temperature sensors 130, 230 at the portions where the large currents flow and come to have the high temperatures within the upper arm semiconductor device 100 and the lower arm semiconductor device 200, chip temperatures of the upper arm semiconductor device 100 and the lower arm semiconductor device 200 can appropriately be measured.

Figure 7:
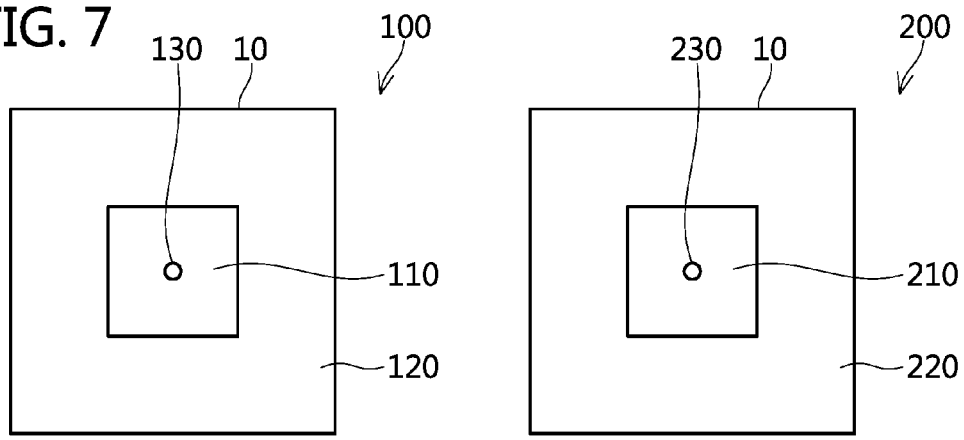
FIG. 7 is a plan view of an upper arm semiconductor device and a lower arm semiconductor device of a reference example of the third embodiment.

FIG. 7 shows a reference example of the third embodiment. As shown in FIG. 7, in this reference example, the upper arm switching device 110 is provided around the upper arm diode 120 where the large current flows in the upper arm semiconductor device 100. In this reference example, the temperature sensor 130 is provided at a center portion of the upper arm diode 120 (that is, a center portion of the semiconductor substrate 10). Similarly, the lower arm diode 220 is provided around the lower arm switching device 210 where the large current flows in the lower arm semiconductor device 200. The temperature sensor 230 is provided at a center portion of the lower arm switching device 210 (that is, a center portion of the semiconductor substrate 10). By intentionally providing the devices Where the large currents flow (upper arm diode 120, lower arm switching device 210) at the center portions of the semiconductor substrate 10 that is most likely to have high temperatures, temperature monitoring by the temperature sensors 130, 230 can be carried out easily.

As above, specific examples of the present invention have been described in detail, however, these are mere exemplary indications and thus do not limit the scope of the claims. The art described in the claims includes modifications and variations of the specific examples presented above. For example, the following modifications may be employed.

Figure 8:
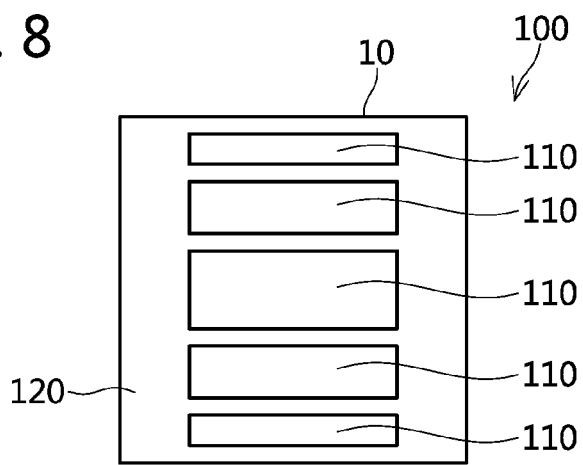
FIG. 8 is a plan view of an upper arm semiconductor device of a modification.
Figure 9:
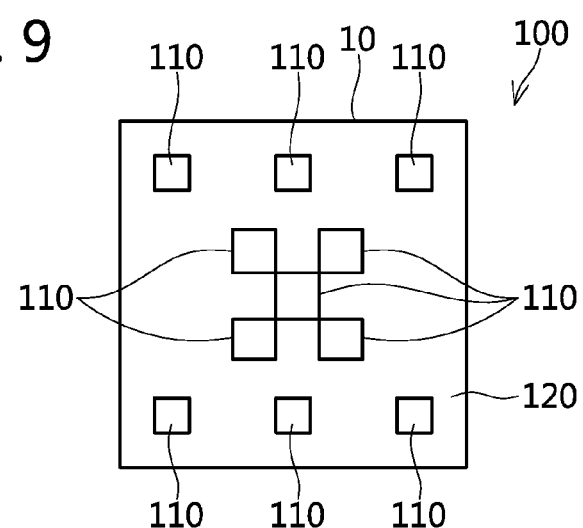
FIG. 9 is a plan view of an upper arm semiconductor device of a modification.
Figure 10:
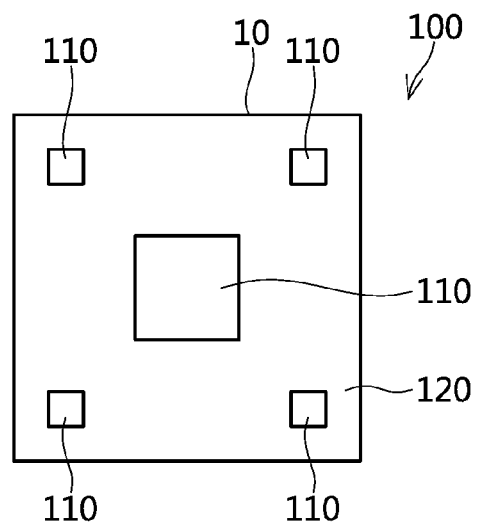
FIG. 10 is a plan view of an upper arm semiconductor device of a modification.

(Modification 1) In the respective embodiments as above, as shown FIGS. 3 and 5, the upper arm switching device 110 is provided in the vicinity of the center of the semiconductor substrate 10 and the upper arm diode 120 is provided around the upper arm switching device 110 in the case of viewing the semiconductor substrate 10 in its plan view. The arrangement of the upper arm switching device 110 and the upper arm diode 120 is not limited to the aforementioned one. For example, as shown in FIGS. 8, 9, and 10, the upper arm switching device 110 and the upper arm diode 120 may be provided by being separated into plural portions. Further, the upper arm switching device 110 and the upper arm diode 120 may be arranged so as to be partitioned and adjacent within the semiconductor substrate 10. The same may apply to the lower arm switching device 210 and the lower arm diode 220. Generally speaking, the total device area of the upper arm switching device and the upper arm diode simply needs to be equal to the total device area of the lower arm switching device and the lower arm diode.

(Modification 2) In the respective embodiments as above, the substrate area of the semiconductor substrate 10 on which the upper arm semiconductor device 100 is arranged is equal to the substrate area of the semiconductor substrate 10 on which the lower arm semiconductor device 200 is arranged. Not being limited hereto, the substrate area of the semiconductor substrate 10 of the upper arm semiconductor device 100 may be different from the substrate area of the semiconductor substrate 10 of the lower arm semiconductor device 200.

(Modification 3) In the respective embodiments as above, the upper arm semiconductor device 100 comprises the upper arm switching device 110 and the upper arm diode 120 on the one piece of semiconductor substrate 10. Similarly, the lower arm semiconductor device 200 comprises the lower arm switching device 210 and the lower area diode 220 on the one piece of semiconductor substrate 10. Not being limited hereto, the upper arm switching device 110 and the upper arm diode 120 may be provided on separate substrates. The lower arm switching device 210 and the lower arm diode 220 may also be provided on separate substrates.

(Modification 4) In the respective embodiments as above, the total device area of the upper arm switching device 110 and the upper arm diode 120 is equal to the total device area of the lower arm switching device 210 and the lower arm diode 220. Not being limited hereto, the total device area of the upper arm switching device 110 and the upper arm diode 120 may be different from the total device area of the lower arm switching device 210 and the lower arm diode 220.

(Modification 5) In the respective embodiments as above, the upper arm switching device 110 and the lower arm switching device 210 are IGBTs. However, the switching devices are not limited to being IGBTs, but may for example be any voluntary switching devices such as MOSFETs (abbreviation of Medal-Oxide-Semiconductor Field-Effect Transistor) or the like.

Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:

1. A semiconductor module comprising:
a first wiring;
a second wiring;
a third wiring;
an upper arm switching device connected between the first wiring and the second wiring;
a lower arm switching device connected between the second wiring and the third wiring;
an upper arm diode connected between the first wiring and the second wiring such that the first wiring is connected to a cathode side; and
a lower arm diode connected between the second wiring and the third wiring such that the second wiring is connected to a cathode side,
wherein at least one of the following (a) and (b) is satisfied:
(a) a ratio of steady loss to switching loss of the upper arm diode is smaller than a ratio of steady loss to switching loss of the lower arm diode;
(b) a ratio of steady loss to switching loss of the upper arm switching device is smaller than a ratio of steady loss to switching loss of the lower arm switching device.

2. The semiconductor module as in claim 1, wherein crystal defects of the upper arm diode are fewer than crystal defects of the lower arm diode.

3. The semiconductor module as in claim 1, wherein the upper arm switching device and the lower arm switching device are IGBTs, and
a p-type impurity density of a collector region of the upper arm switching device is higher than a p-type impurity density of a collector region of the lower arm switching device.

4. The semiconductor module as in claim 1, wherein a total device area of the upper arm switching device and the upper arm diode is equal to a total device area of the lower arm switching device and the lower arm diode.

5. The semiconductor module as in claim 1, wherein the upper arm switching device and the upper arm diode are provided in a first semiconductor substrate, and
the lower arm switching device and the lower arm diode are provided in a second semiconductor substrate.

6. The semiconductor module as in claim 5, wherein a substrate area of the first semiconductor substrate is equal to a substrate area of the second semiconductor substrate.

7. The semiconductor module as in claim 1, wherein the upper arm switching device, the upper arm diode, the lower arm switching device, and the lower arm diode are integrally resin molded.

8. A semiconductor module comprising:
a first wiring;
a second wiring;
a third wiring;
an upper arm switching device connected between the first wiring and the second wiring;
a lower arm switching device connected between the second wiring and the third wiring;
an upper arm diode connected between the first wiring and the second wiring such that the first wiring is connected to a cathode side; and
a lower arm diode connected between the second wiring and the third wiring such that the second wiring is connected to a cathode side,
wherein a ratio of a device area of the upper arm diode to a device area of the upper arm switching device is larger than a ratio of a device area of the lower arm diode to a device area of the lower arm switching device.

9. The semiconductor module as in claim 8, wherein a total device area of the upper arm switching device and the upper arm diode is equal to a total device area of the lower arm switching device and the lower arm diode.

10. The semiconductor module as in claim 8, wherein the upper arm switching device and the upper arm diode are provided in a first semiconductor substrate, and
the lower arm switching device and the lower arm diode are provided in a second semiconductor substrate.

11. The semiconductor module as in claim 10, wherein a substrate area of the first semiconductor substrate is equal to a substrate area of the second semiconductor substrate.

12. The semiconductor module as in claim 8, wherein the upper arm switching device, the upper arm diode, the lower arm switching device, and the lower arm diode are integrally resin molded.

\* \* \* \* \*